(12) United States Patent
Suzuki et al.

(10) Patent No.: US 12,125,650 B2
(45) Date of Patent: Oct. 22, 2024

(54) SWITCH, SWITCH MODULE, AND METHOD OF MANUFACTURING SWITCH MODULE

(71) Applicant: Alps Alpine Co., Ltd., Tokyo (JP)

(72) Inventors: Hajime Suzuki, Miyagi (JP); Hiroshi Wakuda, Miyagi (JP); Ko Owada, Fukushima (JP); Tetsu Numata, Miyagi (JP); Kunio Sato, Miyagi (JP)

(73) Assignee: Alps Alpine Co., Ltd. (JP)

( * ) Notice: Subject to any disclaimer, the term of this patent is extended or adjusted under 35 U.S.C. 154(b) by 167 days.

(21) Appl. No.: 17/865,541

(22) Filed: Jul. 15, 2022

(65) Prior Publication Data

US 2022/0351924 A1    Nov. 3, 2022

Related U.S. Application Data

(63) Continuation of application No. PCT/JP2021/000723, filed on Jan. 12, 2021.

(30) Foreign Application Priority Data

Feb. 6, 2020    (JP) .................................. 2020-019043

(51) Int. Cl.
*H01H 13/85*    (2006.01)
*G06F 3/01*    (2006.01)
(Continued)

(52) U.S. Cl.
CPC ............. *H01H 13/85* (2013.01); *G06F 3/016* (2013.01); *G06F 3/044* (2013.01); *H01H 9/161* (2013.01); *H01H 2003/008* (2013.01)

(58) Field of Classification Search
CPC .. H01H 13/85; H01H 9/161; H01H 2003/008; H01H 3/00; H01H 9/16; G06F 3/016; G06F 3/044; G06F 3/0338; G06F 3/01; H03K 17/9622; H03K 17/975; H03K 2217/96062; H03K 2217/960755; H03K 2217/960785; H03K 2217/9653
See application file for complete search history.

(56) References Cited

U.S. PATENT DOCUMENTS

| 8,890,667 B2 * | 11/2014 | Lim ........................ H01H 13/83 341/27 |
| 2008/0163051 A1 | 7/2008 | Olien |
| 2020/0117274 A1 * | 4/2020 | Brown .................... G06F 3/016 |

FOREIGN PATENT DOCUMENTS

| JP | 2001-307595 A | 11/2001 |
| JP | 2010-515228 A | 5/2010 |
| JP | 2010-218720 A | 9/2010 |

OTHER PUBLICATIONS

International Search Report for corresponding International Application No. PCT/JP2021/000723 dated Mar. 23, 2021 (2 Pages).

* cited by examiner

Primary Examiner — Lheiren Mae A Caroc
(74) Attorney, Agent, or Firm — Harness, Dickey & Pierce, P.L.C.

(57) ABSTRACT

A switch to be attached to a panel having an opening in a surface includes: a stationary member to be attached to the panel; a movable member to be placed at a distance from the panel, the movable member having a manipulation surface separated from the panel in the opening with a gap intervening between the manipulation surface and the panel, the manipulation surface being exposed from the opening; and a vibration element disposed between the stationary member and the movable member, the vibration element vibrating the movable member.

16 Claims, 8 Drawing Sheets

(51) Int. Cl.
*G06F 3/044* (2006.01)
*H01H 9/16* (2006.01)
*H01H 3/00* (2006.01)

SWITCH, SWITCH MODULE, AND METHOD OF MANUFACTURING SWITCH MODULE

CLAIM OF PRIORITY

This application is a Continuation of International Application No. PCT/JP2021/000723 filed on Jan. 12, 2021, which claims benefit of Japanese Patent Application No. 2020-019043 filed on Feb. 6, 2020. The entire contents of each application noted above are hereby incorporated by reference.

BACKGROUND OF THE INVENTION

1. Field of the Invention

The present invention relates to a switch, a switch module, and a method of manufacturing the switch module.

2. Description of the Related Art

There is a conventional surface from which haptic feedback is created. The surface has: an independent area on which a first portion of the surface is formed, the independent area having a circumference; a second area that on which a second portion of the surface is formed, the second area enclosing the circumference of the independent area, the independent area and second area being formed on the same plane of the surface; a void area present between the independent area and the second area, the void area enclosing the circumference of the independent area, the void area separating the independent area from the second area; and a deformable sealing material that forms, on the same plane as the independent area and second area, a consecutive surface together with the first portion and second portion, the sealing material being filled in the void area so that the independent area is easily moved with respect to the second area. The independent area has a surface that comes in contact with an actuator during the haptic feedback. The independent area is a manipulation surface on which the user performs a manipulation (see PCT Japanese Translation Patent Publication No. 2010-515228, for example).

SUMMARY OF THE INVENTION

As for a device having the conventional surface, an actuator is provided on the rear surface opposite to the surface so as to be along one edge of the independent area in a rectangular shape or along two short edges, of the independent area in a rectangular shape, that sandwich the long edges of the independent area. Therefore, it is difficult to evenly vibrate the independent area. When vibration is uneven depending on the position in the independent area, an uncomfortable feeling may be felt during the manipulation of the manipulation surface.

In view of this, the present invention provides a switch, a switch module, and a method of manufacturing the switch module that can all evenly vibrate a manipulation surface.

A switch in an embodiment of the present invention is attached to a panel having an opening in a surface. The switch includes: a stationary member to be attached to the panel; a movable member to be placed at a distance from the panel, the movable member having a manipulation surface separated from the panel in the opening with a gap intervening between the manipulation surface and the panel, the manipulation surface being exposed from the opening; and a vibration element disposed between the stationary member and the movable member, the vibration element vibrating the movable member.

The present invention can provide a switch, a switch module, and a method of manufacturing the switch module that can all evenly vibrate a manipulation surface.

DESCRIPTION OF THE PREFERRED EMBODIMENTS

Embodiments to which a switch, a switch module, and a method of manufacturing the switch module in the present invention are applied will be described below.

Embodiments

Figure 1:
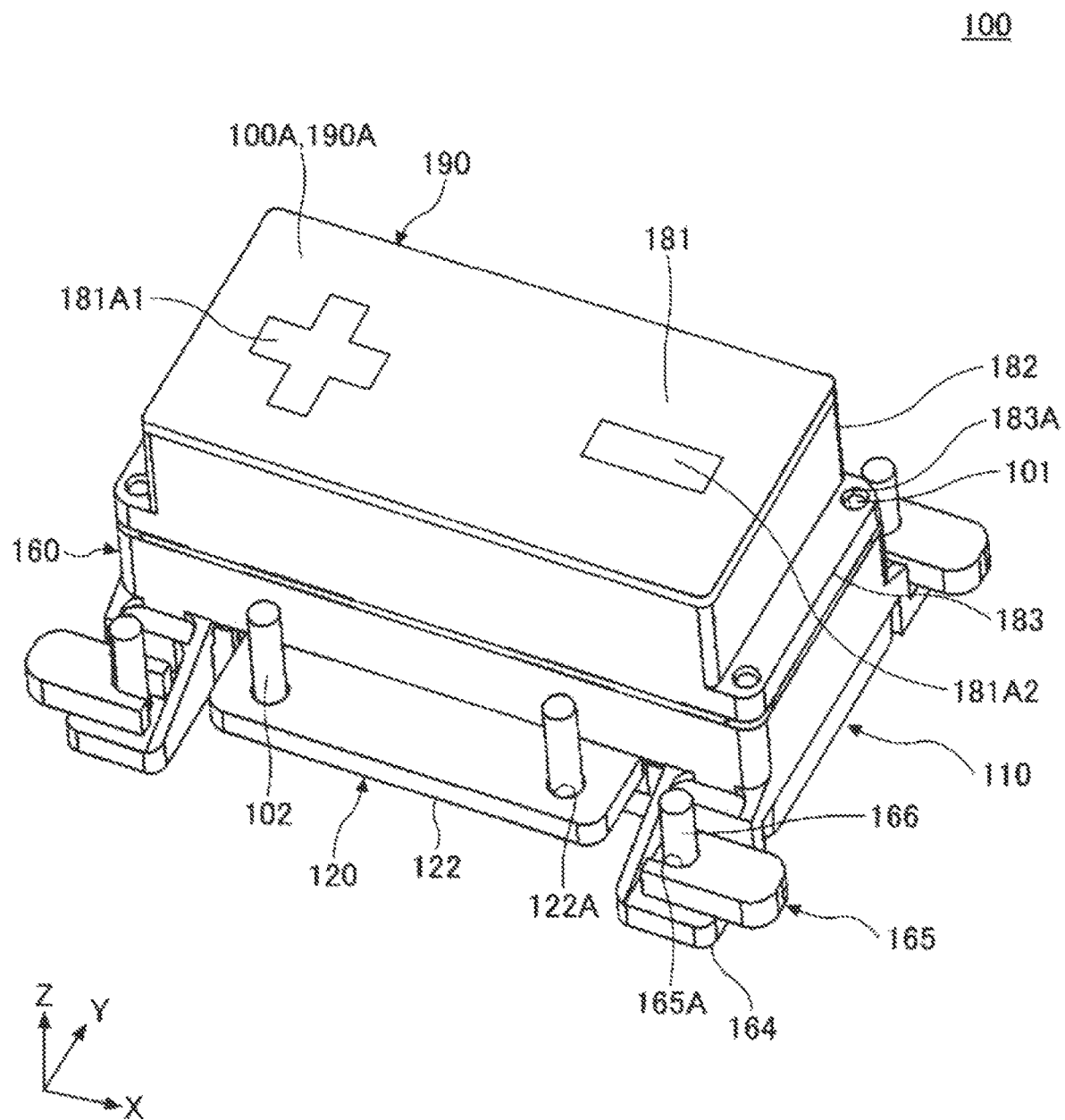
FIG. 1 illustrates a switch in an embodiment.
Figure 2:
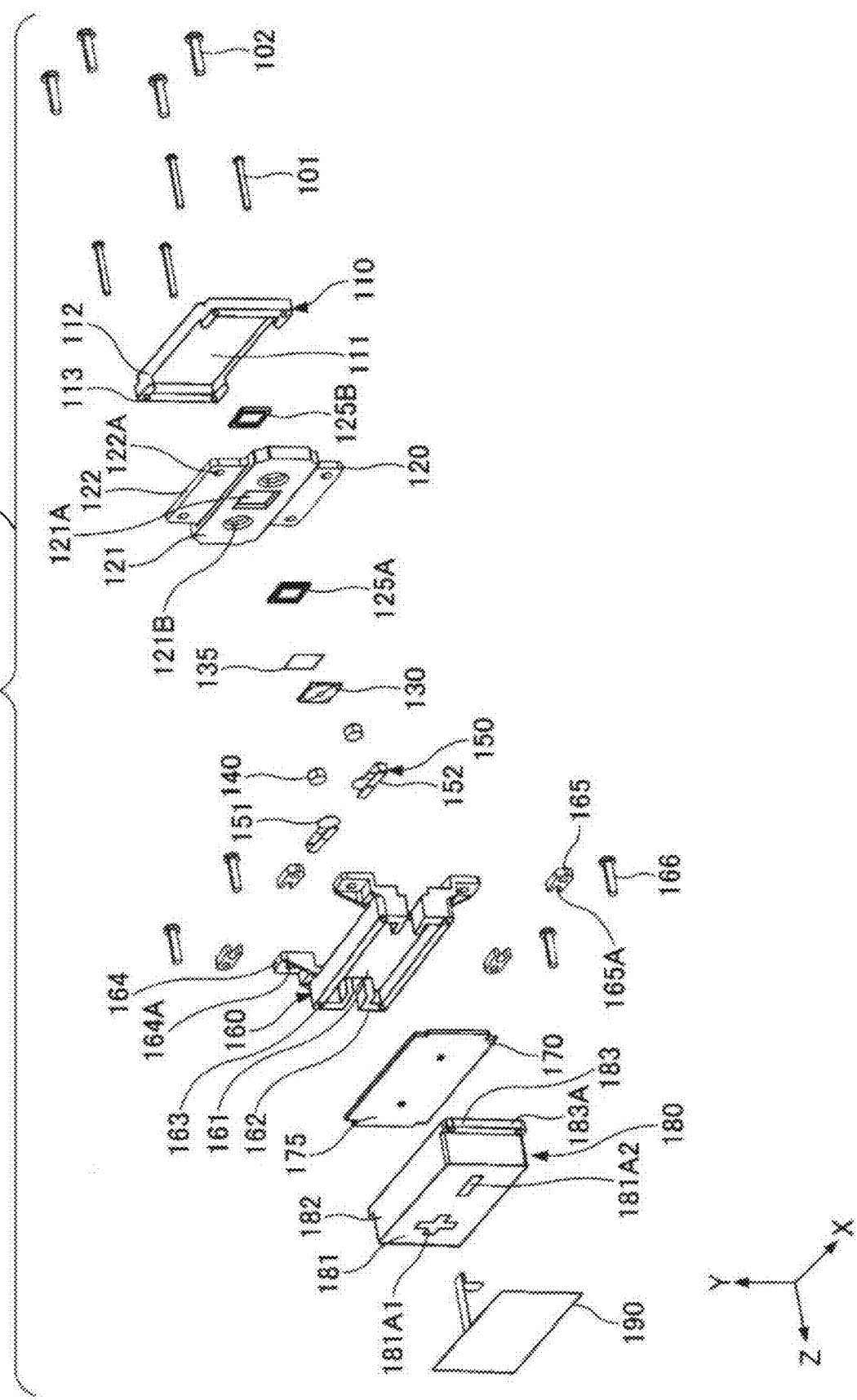
FIG. 2 is an exploded view of the switch.
Figure 3:
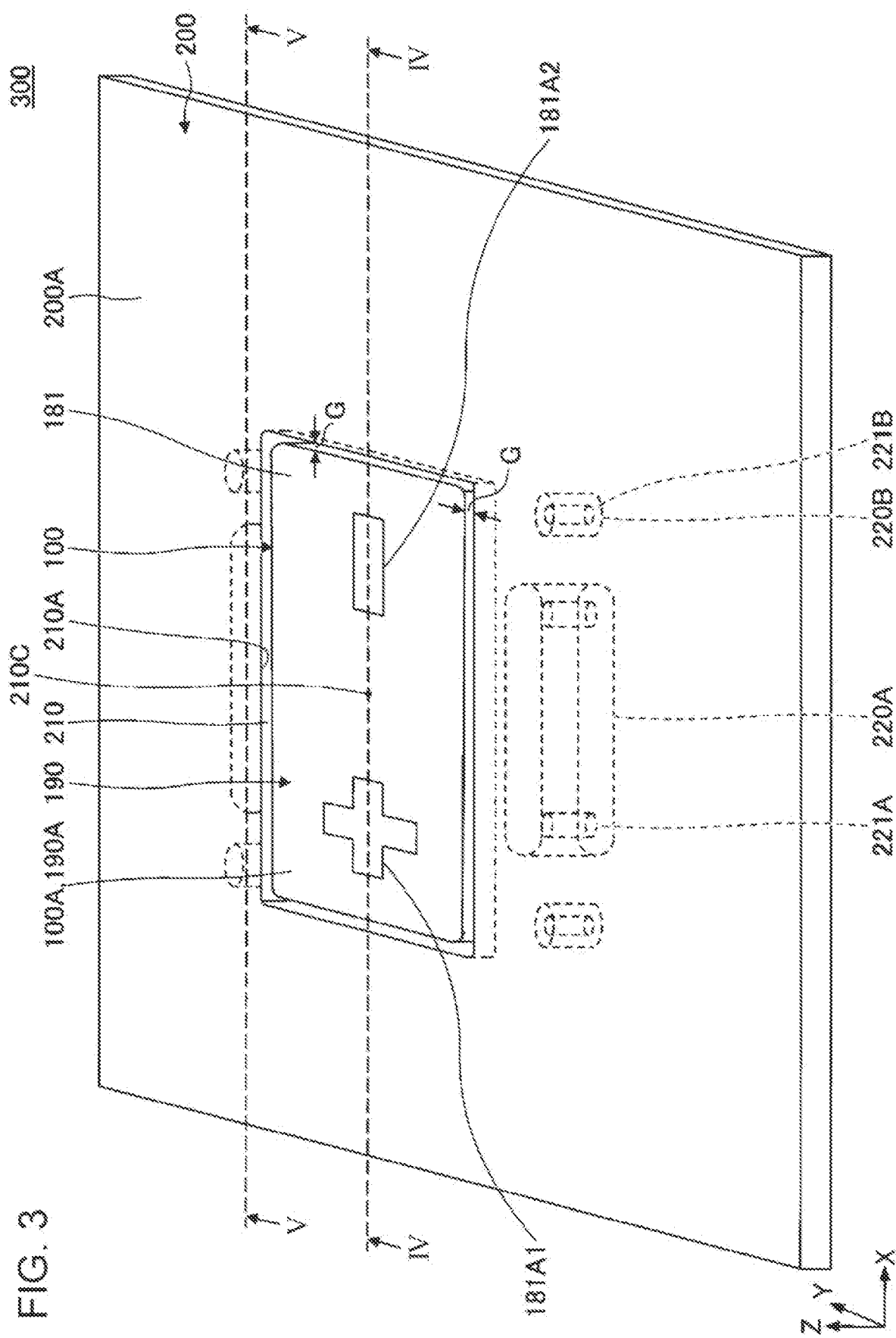
FIG. 3 illustrates a switch module in an embodiment.
Figure 4:
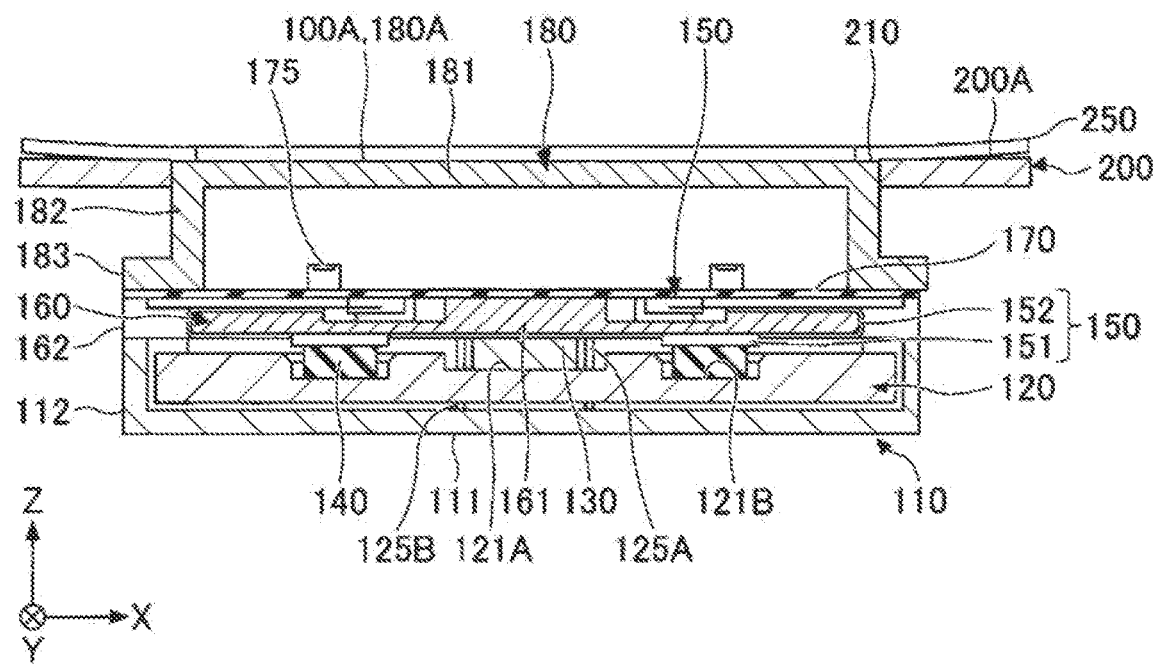
FIG. 4 is a sectional view taken along line IV-IV in FIG. 3.
Figure 5:
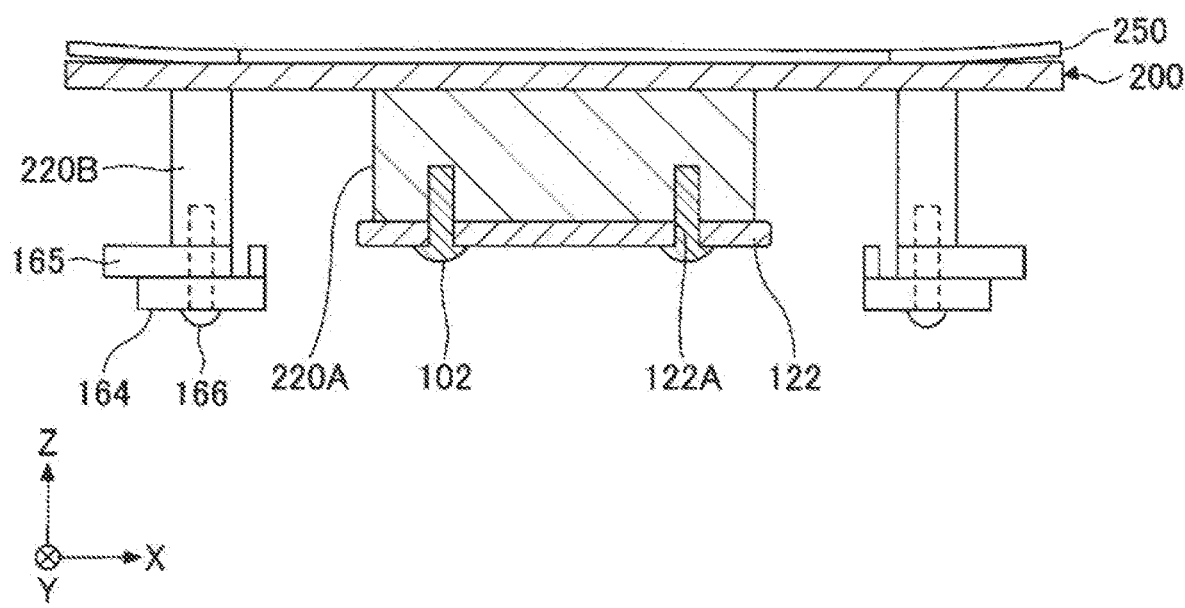
FIG. 5 is a sectional view taken along line V-V in FIG. 3.

FIG. 1 illustrates a switch 100 in an embodiment. FIG. 2 is an exploded view of the switch 100. FIG. 3 illustrates a switch module 300 in an embodiment. FIG. 4 illustrates a sectional view taken along line IV-IV in FIG. 3. FIG. 5 illustrates a sectional view taken along line V-V in FIG. 3.

The cross section illustrated in FIG. 4 passes through the center of the switch 100 in the Y direction and is parallel to an XZ plane. The cross section illustrated in FIG. 5 passes through the center of a screwing section 220A of a panel 200 in the Y direction and is parallel to an XZ plane. The cross sections in FIGS. 4 and 5 are in a state in which a decorative sheet 250 is attached to the surface of the switch module 300 illustrated in FIG. 3.

In the description below, an XYZ coordinate system is defined. For convenience of explanation, in the description below, a plan view refers to an XY plan view and an up-down relationship is used in which the positive-direction side of the Z axis is the upper side and the negative-direction side of the Z axis is the lower side. However, the up-down relationship does not represent a universal up-down relationship.

As illustrated in FIG. 3, the switch module 300 includes the switch 100 and panel 200. The switch 100 has a manipulation surface 100A. When a pressing manipulation in which the user presses the manipulation surface 100A downward is performed, the switch 100 gives a tactile sense by vibrating the manipulation surface 100A. The manipulation of the user is a manipulation in which the user directly touches the manipulation surface 100A or the decorative sheet 250, which will be described later, with a skin (typically, the skin of a hand or the like) or a manipulation in which the user indirectly touches the manipulation surface 100A through a stylus pen or a glove. To give a tactile sense, the switch 100 generates, on the manipulation surface 100A, vibration with a frequency band that can be sensed by the sense organ of the skin of the human.

The panel 200 is a plate-like member formed from a resin or a metal, as an example. The panel 200 has an upper surface 200A, a through-hole 210, and an opening 210A forming the through-hole 210. The through-hole 210 and the opening 210A forming the through-hole 210 are exposed to the upper surface 200A. The through-hole 210 passes through the panel 200 in the Z direction with the size of the opening 210A in plan view. Therefore, the positional relationship between the opening 210A and other constituent elements in plan view is synonymous with the positional relationship between the through-hole 210 and other constituent elements in plan view.

A knob 180 is inserted into space enclosed by the inner walls of the through-hole 210 so that the upper end of the knob 180 is exposed from the through-hole 210 when viewed from the positive-direction side of the Z axis. A gap G in an XY plane between the opening 210A and the manipulation surface 100A is equal to a gap in an XY plane between the knob 180 and the inner wall of the through-hole 210.

The panel 200 has two screwing sections 220A and four screwing sections 220B, indicated by dashed lines in FIG. 3, on the rear side (lower surface side). The rear side (lower surface side) is the rear side with respect to the upper surface 200A and is the rear surface side of the panel 200.

The screwing sections 220A and 220B are each a columnar member protruding from the lower surface of the panel 200 in the downward direction. Each screwing section 220A has two screw holes 221A formed so as to be spaced in the X direction. Since two screw holes 221A are formed for each of the two screwing sections 220A, the panel 200 has four screw holes 221A.

Each screwing section 220B has one screw hole 221B. Each screw hole 221A has a screw groove corresponding to a screw 102 in the inner circumferential surface. Each screw hole 221B has a screw groove corresponding to a screw 166 in the inner circumferential surface.

The screwing section 220A is disposed along the X direction in the vicinity of the opening 210A in plan view. The four screw holes 221A are disposed so as to sandwich the opening 210A along the Y direction and be separated by a predetermined spacing along the X direction in plan view. Therefore, the four screw holes 221A are placed so as to essentially enclose the opening 210A.

The screwing section 220B and screw hole 221B are placed so as to be at a position more distant from the switch 100 than the screwing section 220A is in the Y direction and be positioned on both sides of the screwing section 220A in the X direction. The screwing section 220B and screw hole 221B are also placed in the vicinity of both ends of the opening 210A in the X direction in plan view.

The switch 100 is attached to the panel 200 by being fixed to the screwing sections 220A on the rear side (lower surface side) of the panel 200 so that the manipulation surface 100A faces in the positive direction of the Z axis. The use of the screwing section 220B will be described later.

When the switch 100 has been attached to the panel 200, the manipulation surface 100A of the switch 100 is exposed from the opening 210A and the upper surface 200A and manipulation surface 100A are positioned on the same plane in the Z direction. It suffices for at least part of the manipulation surface 100A to be positioned on the same plane as the upper surface 200A, so the manipulation surface 100A may have a recessed portion or projecting portion, which will be described later in detail. The phase "positioned on the same plane" purports that a case is also included in which there is a displacement between the manipulation surface 100A and the upper surface 200A due to manufacturing error or the like.

There is the gap G between the manipulation surface 100A and the opening 210A in plan view. The gap G is similarly provided between the side wall of the knob 180 on the upper end side and the inner wall of the through-hole 210 as well. The switch 100 is attached to the panel 200 only through the screwing sections 220A. The gaps G prevent the vibration of the manipulation surface 100A from transmitting to the panel 200.

The switch module 300 of this type may further include the decorative sheet 250 (see FIGS. 4 and 5), which covers both the manipulation surface 100A and the upper surface 200A.

Each portion of the switch 100 will be described below.

The switch 100 includes a lower case 110, a holder 120, an actuator 130, two dampers 140, two pressure sensors 150, a base 160, four spacers 165, a circuit board 170, two light emitting diodes (LEDs) 175, the knob 180, and a capacitive sensor 190, as main constituent elements. The switch 100 further includes screws 101, screws 102, rubber members 125A and 125B, a double-sided tape 135, and screws 166.

The lower case 110 is an example of a case member. The holder 120 is an example of a stationary member. Four through-holes 122A in the holder 120 are an example of a plurality of attachment portions. The actuator 130 is an example of a vibrating element. The damper 140 is an example of an elastic member. The pressure sensor 150 is an example of a pressing manipulation detection unit. The base 160 is an example of a base portion. The spacer 165 is an example of a restricting member. The circuit board 170 is an example of a plate-like member. The LED 175 is an example of a light source. The knob 180 is an example of a manipulation member, and functions as an upper case. The capacitive sensor 190 is an example of a position detection unit.

A combination of the lower case 110, base 160, circuit board 170, and knob 180 is an example of a movable member. Of the movable member, a combination of the lower case 110 and base 160, other than the circuit board 170, which is an example of the plate-like member, and the knob 180, which is an example of the manipulation member, is an example of a movable body that can move relative to the stationary member. Since the lower case 110 and base 160, which forms the movable body, can move with respect to the holder 120 used as the stationary member, the lower case 110 and base 160, which form the movable body, can move relative to the holder 120 used as the stationary member. Although an aspect will be described here in which the lower case 110 and base 160 are separate components, the lower case 110 and base 160 may be formed so as to be integrated together.

The actuator 130, pressure sensor 150, LED 175, and capacitive sensor 190 are connected to a control device (not illustrated) in the outside through cables or the likes. The control device controls the driving of the actuator 130, acquires a detection result from the pressure sensor 150, controls the turning-on of the LED 175, and acquires a detection result from the capacitive sensor 190.

Figure 6:
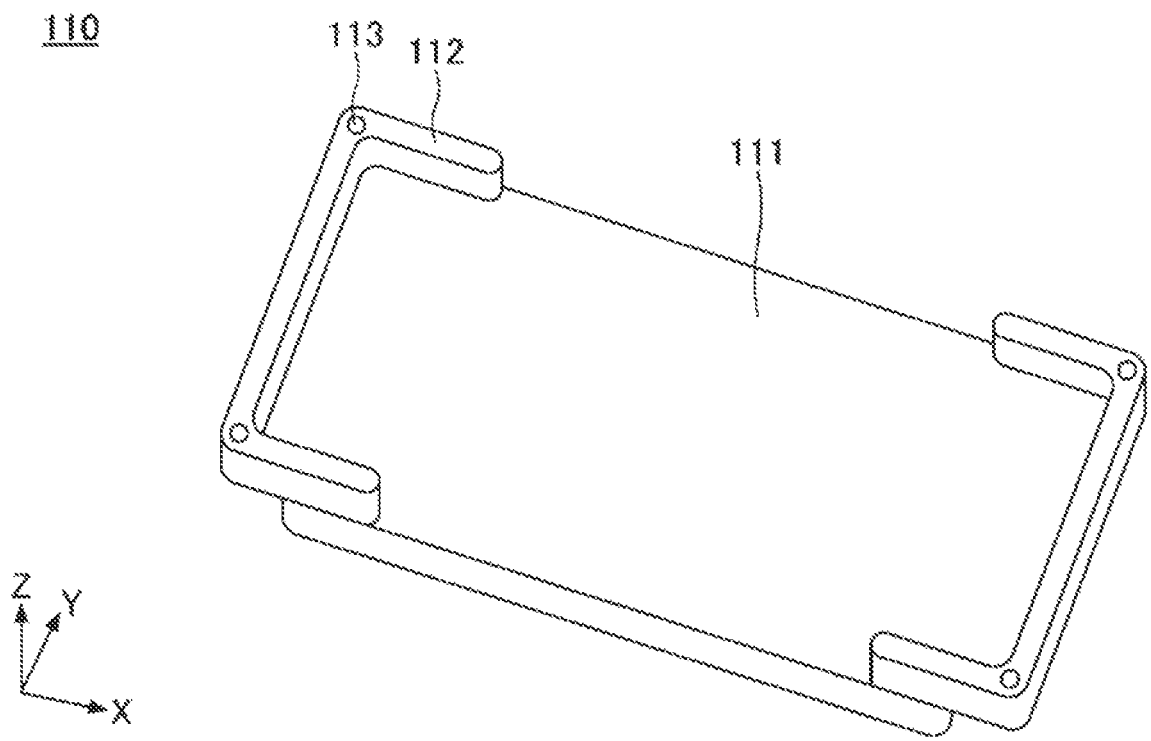
FIG. 6 illustrates a lower case.
Figure 7:
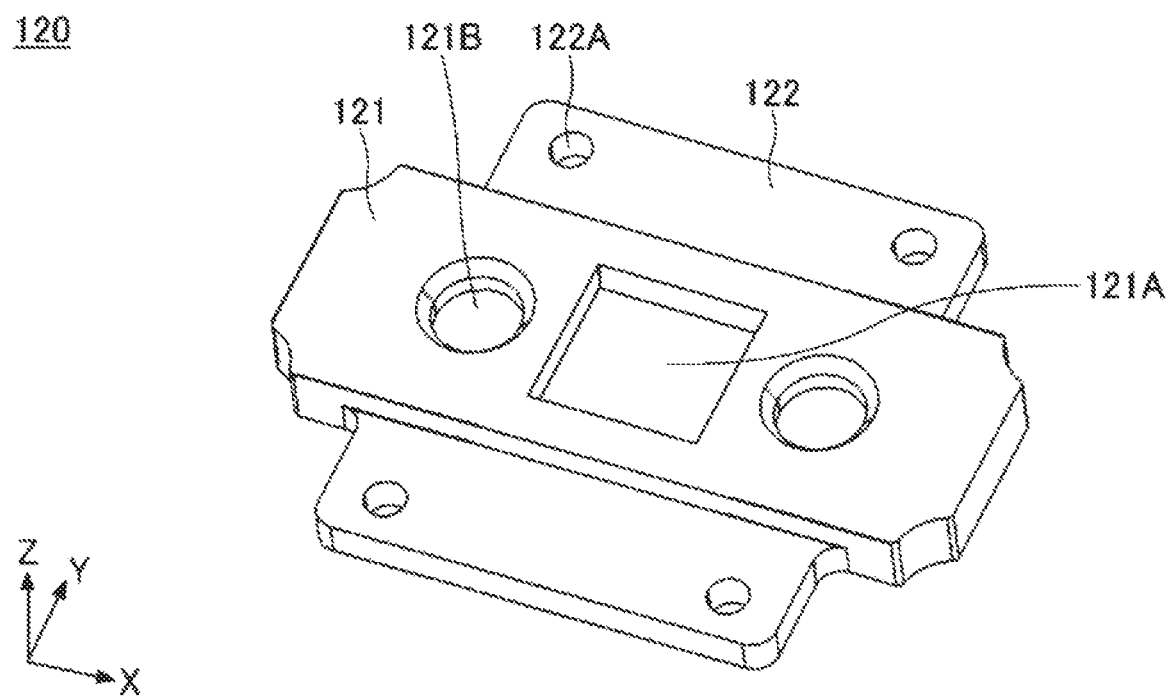
FIG. 7 illustrates a holder.
Figure 8:
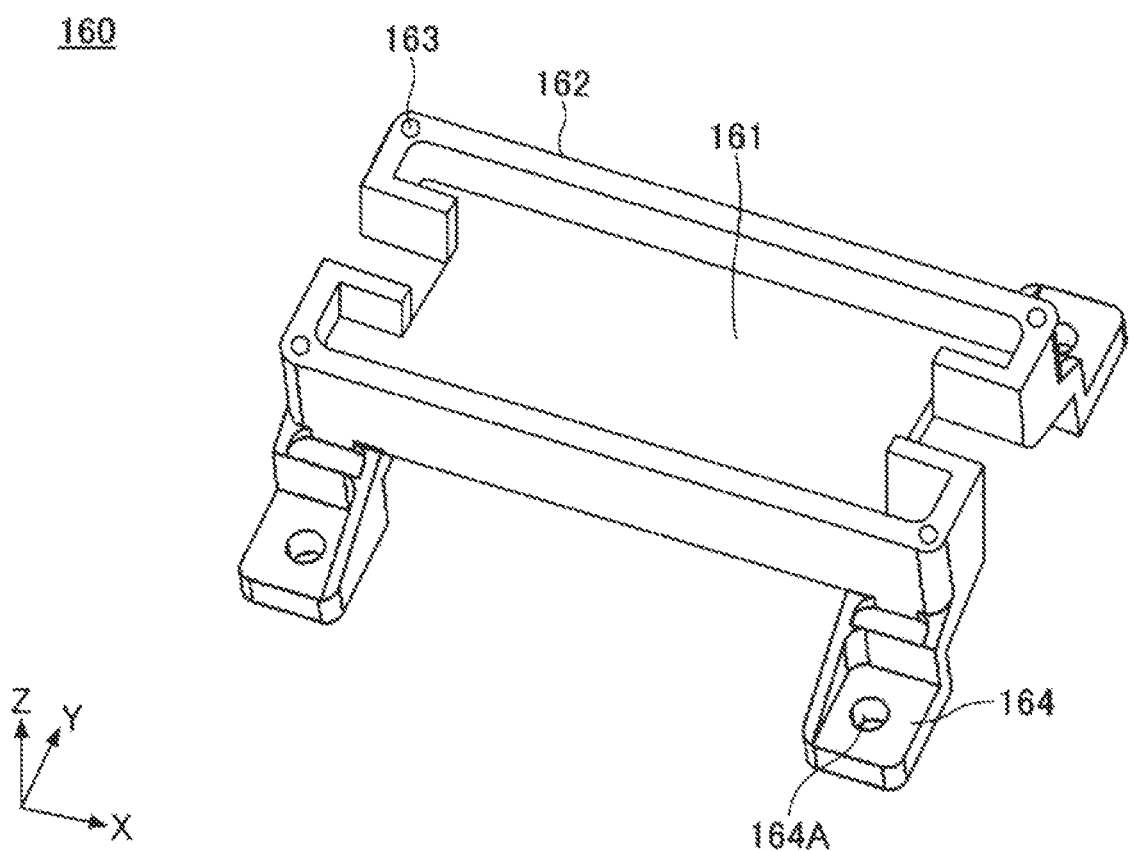
FIG. 8 illustrates a base.
Figure 9:
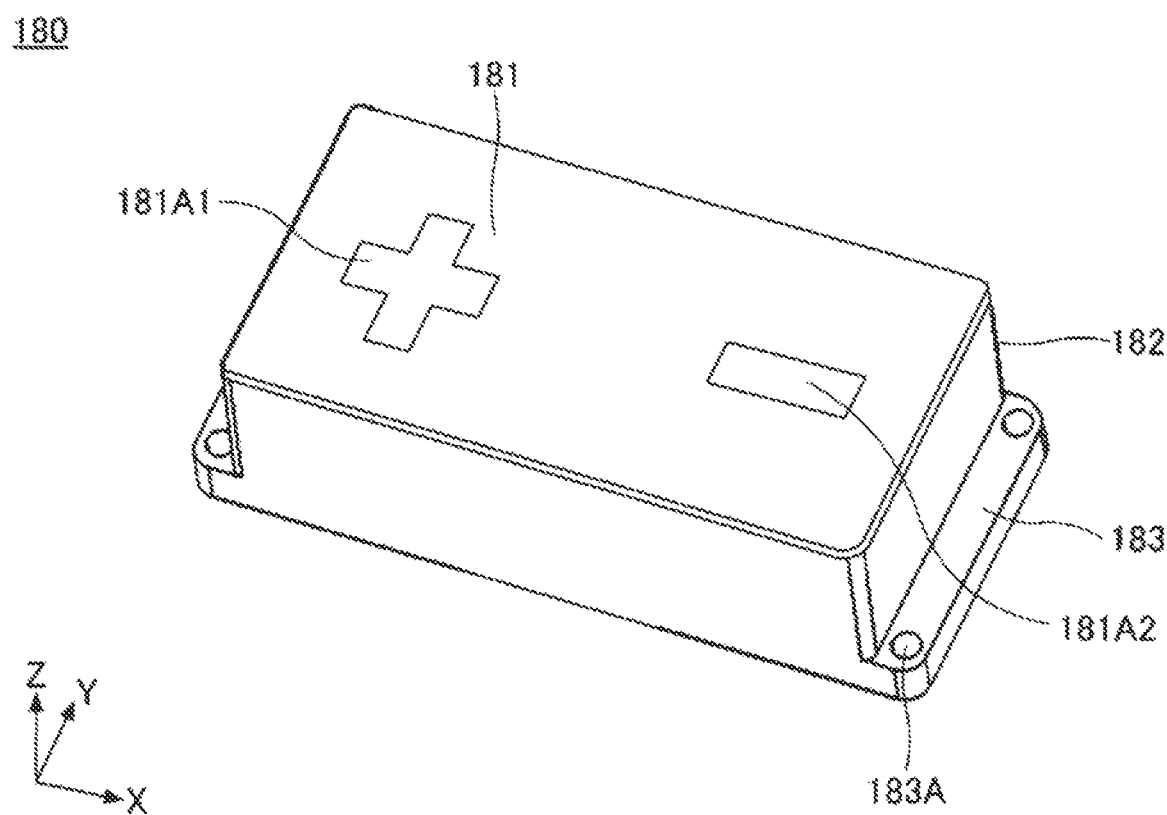
FIG. 9 illustrates a knob.

In the description below, FIGS. 6 to 9 will also be referenced, in addition to FIGS. 1 to 5. FIG. 6 illustrates the lower case 110. FIG. 7 illustrates the holder 120. FIG. 8 illustrates the base 160. FIG. 9 illustrates the knob 180.

As illustrated in FIG. 6, the lower case 110 has a main body 111, walls 112, and four through-holes 113. The main body 111 is a plate-like member, which is substantially in a rectangular shape in plan view. The longitudinal direction of the main body 111 matches the X direction. The wall 112 protrudes upward from a segment of the periphery of the main body 111. The four through-holes 113 are formed at the four corners of the main body 111 so as to pass through the main body 111 in the Z direction. In this embodiment, the walls 112 are present at the four corners of the main body 111, and the four through-holes 113 are formed in the walls 112 positioned at the four corners of the main body 111. The lower case 110 is fixed together with the base 160 and knob 180, which will be described later.

As illustrated in FIG. 7, the holder 120 has a main body 121 and two extensions 122. The main body 121 is a plate-like portion, which is substantially in a rectangular shape in plan view. The main body 121 has a size with which the main body 121 can be stored in an area enclosed by the walls 112 of the lower case 110. The holder 120 is placed between the lower case 110 and the base 160, in a state in which a rubber member 125B is sandwiched between the lower surface of the holder 120 and the upper surface of the main body 111 of the lower case 110, which will be described later in detail. The holder 120 is not in direct contact with the base 160 or knob 180. The rubber member 125B is a lump of rubber in a rectangular ring shape in plan view, as an example. The rubber member 125B adjusts the frequency of vibration generated by the actuator 130.

The lower case 110, base 160, circuit board 170, and knob 180 are held by the holder 120 through the two dampers 140 placed above the holder 120 and the rubber member 125B placed below the holder 120. Since the rubber member 125B is deformable in the Z direction, the rubber member 125B holds the lower case 110 so as to be movable with respect to the holder 120.

The main body 121 has a recessed portion 121A and recessed portions 121B. The recessed portion 121A is formed at the center on the upper surface of the main body 121, the recessed portion 121A being in a rectangular shape in plan view. Two recessed portions 121B are formed on both sides of the recessed portion 121A in the X direction, each recessed portion 121B being circular in plan view.

The center of the recessed portion 121A in plan view matches the center of the holder 120 in plan view. The recessed portion 121A and recessed portions 121B are placed so as to have point symmetry with respect to the center of the holder 120 in plan view or so as to have line symmetry with respect to a line passing through the center of the holder 120 in plan view, the line being parallel to the Y axis.

The two extensions 122 are plate-like portions, one of which extends in the +Y direction from the central portion of the main body 121 in the X direction, and the other of which similarly extends in the −Y direction. Each extension 122 has two through-holes 122A. At both ends of each extension 122 in the X direction, the two through-holes 122A pass through the extension 122 in the Z direction.

The holder 120 is fixed to the panel 200 by screwing the four screws 102, which are passed into the four through-holes 122A from below, into the screw holes 221A in the screwing portion 220A on the rear surface of the panel 200. The four through-holes 122A are formed so that, in a state in which the switch 100 is attached to the panel 200, the through-holes 122A are positioned outside the opening 210A in plan view so as to enclose the opening 210A.

Specifically, in a state in which the switch 100 is attached to the panel 200, the four through-holes 122A are evenly positioned around the opening 210A in plan view. The four through-holes 122A that are evenly positioned around the opening 210A in plan view means that the four through-holes 122A are positioned so that a spacing between each two through-holes 122A becomes equal around the opening 210A in a rectangular shape with respect to a center 210C without becoming uneven with respect to the center 210C.

To evenly position the four through-holes 122A around the opening 210A, two through-holes 122A may be arranged in the X direction on the +Y-direction side of the opening 210A in plan view and the remaining two through-holes 122A may be arranged in the X direction on the −Y-direction side of the opening 210A in plan view. The +Y-direction side is an example of a first side of the opening 210A, and the −Y-direction side is an example of a second side of the opening 210A. With the opening 210A sandwiched, there is a match in the X direction between the positions of the two through-holes 122A on the +Y-direction side and the positions of the two through-holes 122A on the −Y-direction side.

The reason why the four through-holes 122A are evenly positioned around the opening 210A in plan view as described above is to even rigidity for planar attachment of the holder 120 to the panel 200 with respect to the center 210C of the opening 210A and, in the ultimate sense, to generate even vibration on the manipulation surface 100A.

The switch 100 is fixed to the panel 200 through the holder 120. Portions other than the holder 120 are distant from the panel 200.

The actuator 130 is a vibration element that uses a piezoelectric element, as an example. When a voltage is applied, the actuator 130 generates vibration in the ±Z direction. The actuator 130 is fixed to the interior of the recessed portion 121A in the holder 120 with the double-sided tape 135. The lower surface, fixed to the holder 120, of the actuator 130 is an example of a first surface. The upper surface, in contact with the base 160, of the actuator 130 is an example of a second surface.

The actuator 130 generates vibration on the manipulation surface 100A. When vibration generated by the actuator 130 is in the ±Z direction, if vibration is in the same direction as the manipulation direction during the pressing of the manipulation surface 100A in the Z direction, the manipulator easily perceives the vibration. When horizontal vibration along an XY plane is generated, it is hard for vibration to propagate to the base 160, which is in contact with the actuator 130 along the Z direction. As a result, stable generation of vibration by the manipulation surface 100A may be prevented.

The reason why the actuator 130 is fixed to the holder 120 is that since the holder 120 is a stationary member fixed to the panel 200, the actuator 130 is attached to the stationary member to cause the manipulation surface 100A to efficiently vibrate.

The rubber member 125A is disposed to the outer edge of the lower surface of the actuator 130 so as to enclose the double-sided tape 135. The rubber member 125A is a lump of rubber in a rectangular ring shape in plan view, as an example. The rubber member 125A adjusts the frequency of vibration generated by the actuator 130.

The damper 140 is a lump of elastic rubber. The two dampers 140 are disposed in the two recessed portions 121B in the holder 120. Each damper 140 may be sandwiched between the bottom surface of the recessed portion 121B in the holder 120 and the lower surface of the base 160.

The damper 140 may have a predetermined spring constant. The spring constant of the damper 140 stipulates the frequency of the vibration of the manipulation surface 100A. When a pressing manipulation in which the user presses the manipulation surface 100A down is performed, the damper 140 slightly contracts in the Z direction. The damper 140 also contracts in the Z direction when the actuator 130 vibrates.

The holder 120 holds the base 160 so that the base 160 can vibrate through the dampers 140 and can slightly move in the Z direction, which will be described later in detail. The holder 120 is connected to the lower case 110 through the rubber member 125B, and is also connected to the base 160 and knob 180 through the two dampers 140, the actuator 130, and the rubber member 125A.

The thickness of the damper 140 in the Z direction is set so that the upper surface of the actuator 130 comes into contact with the lower surface of the base 160 and the actuator 130 can vibrate the base 160. Since the two dampers 140 are placed on both sides by which the actuator 130 is sandwiched in the X direction, which is the longitudinal direction of the switch 100, the lower case 110, base 160, and knob 180 can be efficiently and stably vibrated by the holder 120.

The two pressure sensors 150 are provided in correspondence to the two dampers 140 to detect a pressing manipulation in which the user presses the manipulation surface 100A down. Each pressure sensor 150 has a sensor portion 151 and a wiring portion 152.

The sensor portion 151 has two electrodes disposed so as to be separated from each other in the Z direction. The sensor portion 151 is disposed in a state in which it is sandwiched between the upper surface of the damper 140 and the lower surface of the base 160. The wiring portion 152 has one end connected to the sensor portion 151 and another end connected to wiring on the circuit board 170. Between the one end and the other end, a U-shape is formed. The wiring portion 152 having a U-shape extends from the lower surface side of the base 160 through its side surface toward its upper surface side. Like this, the pressure sensor 150 is disposed from the lower surface of the base 160 to its front surface.

When a pressing manipulation is performed and the distance between the two electrodes provided in the sensor portion 151 changes, the capacitance changes accordingly. Then, the pressure sensor 150 outputs a signal to the control device through the circuit board 170.

As illustrated in FIG. 8, the base 160 has a main body 161, walls 162, through-holes 163, and legs 164. The main body 161 is a rectangular plate-like portion in plan view and is enclosed by the walls 162. Each wall 162 protrudes upward from the rectangular outer edge of the main body 161. Four through-holes 163 are formed at the four corners of the walls 162. In this embodiment, the walls 162 are present at the four corners of the main body 161, and the four through-holes 163 are formed in the walls 162 positioned at the four corners of the main body 161.

Four legs 164 extend in the Y direction from the bottoms of the four corners of the main body 161. Two of the four legs 164 extend in the −Y direction from the two corners of the main body 161 on the −Y-direction side. The remaining two legs 164 extend in the +Y direction from the two corners of the main body 161 on the +Y-direction side. At the top of each leg 164, a through-hole 164A, which passes through the top in the Z direction, is formed.

The circuit board 170 is placed on the walls 162 on the upper surface of the main body 161 of the base 160. Spacers 165 are attached to the upper surfaces of the tops of the four legs 164 with the screws 166.

The spacer 165 is a member used when the decorative sheet 250 is attached. Specifically, spacer 165 is used when the decorative sheet 250 is attached to the upper surfaces (manipulation surface 100A and upper surface 200A) of the switch module 300.

The spacer 165 is used so that even when a downward load is applied to the manipulation surface 100A during the attachment of the decorative sheet 250, the load is not applied to the actuator 130 or pressure sensor 150. This is to suppress damage to the actuator 130 and pressure sensor 150.

The spacer 165 is a member substantially in a U-shape in plan view. The spacer 165 has a notch 165A used to pass the screw 166. The screw 166 is passed through the notch 165A. The notch 165A positions the screw 166 by catching it.

The spacer 165 is placed between the upper surface of the leg 164 of the base 160 and the lower end of the screwing section 220B of the panel 200 in a state in which the through-hole 164A in the base 160, the screwing section 220B of the panel 200, and the notch 165A are aligned.

The thickness of the spacer 165 in the Z direction is set so as to be equal to the distance between the upper surface of the top of the leg 164 and the lower end of the screwing section 220B in a state in which the switch 100 is attached to the panel 200.

The spacer 165 is fixed between the upper surface of the leg 164 and the lower end of the screwing section 220B by passing the screw 166 through the through-hole 164A and notch 165A and screwing the screw 166 into the screw hole 221B in the screwing section 220B in a state in which the spacer 165 is aligned and sandwiched between the upper surface of the leg 164 of the base 160 and the lower end of the screwing section 220B of the panel 200.

The knob 180 is fixed onto the base 160. In a state in which each spacer 165 is attached between the leg 164 and the screwing section 220B, the base 160 and knob 180 are supported from above by the panel 200. Therefore, the knob 180 is fixed in a state in which the knob 180 cannot move in the Z direction. As a result, even when a downward load is applied to the knob 180, it does not move downward. Therefore, the load is applied to the panel 200 through the spacer 165. Since the base 160 does not also move downward, the damper 140 does not contract in the Z direction. This can prevent the load from being applied to the actuator 130 and pressure sensor 150.

Since the spacer 165 is sandwiched between the leg 164 and the screwing section 220B in a state in which the screw 166 is passed through the notch 165A, after the decorative sheet 250 has been attached, the spacer 165 can be removed by removing the screw 166 and then pulling out the spacer 165 in a direction opposite to the direction in which the notch 165A is formed. In a state in which the spacer 165 is removed, the knob 180 can shift downward. Thus, since it suffices to fix the movable member by connecting the movable member to the panel 200 by using the spacers 165, the lower case 110, circuit board 170, and knob 180 may be fixed to the screw holes 221B in the panel 200.

A through-hole may be provided instead of the notch 165A. Since one side of the notch 165A is open unlike the through-hole, however, the screw 166 can be inserted between the upper surface of the leg 164 and the lower end of the screwing section 220B of the panel 200 even in a state in which the screw 166 has been screwed into the screw hole 221B in the screwing section 220B to a certain extent. Therefore, the notch 165A is convenient in handling.

The circuit board 170 is a wiring board, on which metallic wiring is provided on a sheet-like substrate made from an insulative material, as an example. The circuit board 170 is formed in substantially the same shape as the outside shape of the base 160 and the outside shape of the wall 162 when viewed in plan view. The circuit board 170 is fixed in a state in which the circuit board 170 is sandwiched between the walls 162 of the base 160 and the side walls 182 and extensions 183, which will be described later, of the knob 180. The actuator 130, pressure sensors 150, and capacitive sensor 190 are connected to the circuit board 170 through cables (not illustrated), or the like. The two LEDs 175 may be mounted on the upper surface of the circuit board 170 with a spacing between them in the X direction. At the four corners of the circuit board 170, notches (not illustrated) are formed at positions corresponding to the four through-holes 163 in the base 160.

The LED 175 illuminates the knob 180 from the rear surface side to improve visibility during the manipulation of the knob 180 by the manipulator. One of the two LEDs 175 is positioned at the center in a half area of the upper surface of the knob 180 on the +X-direction side in plan view. The other LED 175 is positioned at the center in the other half area on the −X-direction side.

The knob 180 has an upper plate 181, the side walls 182, and the extensions 183. The knob 180 has a structure in which there is no bottom and the interior is hollow. The upper plate 181 is a rectangular plate-like portion in plan view. The side wall 182 extends downward from the outer edge of the upper plate 181. The upper surface of the upper plate 181 is the upper surface of the knob 180.

The capacitive sensor 190 is attached to the upper surface of the knob 180 with a double-sided tape (not illustrated). Wiring of the capacitive sensor 190 is connected to the circuit board 170 through a through-hole (not illustrated) or the like, the through-hole passing through the upper plate 181, as an example.

The upper plate 181 has transmission portions 181A1 and 181A2 that can transmit light from the LEDs 175. One of the transmission portions 181A1 and 181A2 is disposed in a half area of the knob 180 on the −X-direction side. The other of the transmission portions 181A1 and 181A2 is disposed in the other half area on the +X-direction side. They have the shapes of the + (plus) and − (minus) symbols, as an example. The shapes of the transmission portions 181A1 and 181A2 are not limited to the + (plus) and − (minus) symbols, as an example. The shapes may be figures or symbols that represent functions assigned to the half area of the knob 180 on the −X-direction side and to the other half area on the +X-direction side.

The upper plate 181 may not have the transmission portions 181A1 and 181A2. In this case, the switch 100 may not include the LEDs 175. In addition, the number of transmission portions 181A1 and 181A2 may not be 2. Their count may be increased or decreased according to the application. In this case, the shapes of the capacitive sensor 190 and the like can be appropriately modified.

The side walls 182 form a rectangular ring shape in plan view. Each side wall 182 has a predetermined height (length in the Z direction). The extension 183 is formed so as to protrude in the X direction from the lower end of each side wall 182 parallel to the Y axis. The extension 183 has, at both ends in the Y direction, screw holes 183A passing through the extension 183 in the Z direction. A screw groove corresponding to the screw 101 is formed in the inner circumferential surface of the screw hole 183A.

In a state in which the switch 100 is attached to the panel 200, a gap is provided between the manipulation surface 100A and the opening 210A. Specifically, a gap is provided between the side walls 182 of the knob 180 and the opening 210A. Due to the presence of this gap, it is possible to prevent vibration generated on the manipulation surface 100A from propagating to the panel 200.

The capacitive sensor 190 is attached to the upper surface of the knob 180 with a double-sided tape. The capacitive sensor 190 has a sensor having two rectangular transparent electrodes disposed with a spacing between them in the X direction in plan view. The capacitive sensor 190 can identify and detect a manipulation for a half of the manipulation surface 100A on the −X-direction side and a manipulation for the other half on the +X-direction side.

The upper surface 190A of the capacitive sensor 190 is the manipulation surface 100A of the switch 100. The manipulation surface 100A is positioned on the same plane as the upper surface 200A of the panel 200. However, a case in which there is a deviation between the manipulation surface 100A and the upper surface 200A due to manufacturing error or the like is included in a case in which they are positioned in the same plane.

The manipulation surface 100A may partially have a recessed portion or a projecting portion. The manipulation surface 100A suffices if at least part of it is positioned in the same plane as the upper surface 200A of the panel 200.

The switch 100 may not include the capacitive sensor 190.

The switch 100 of the type above can be assembled (manufactured) as follows. First, the lower case 110 is placed below the holder 120, after which the circuit board 170 to which the dampers 140, pressure sensors 150, base 160, and LEDs 175 have been attached and the knob 180 to which the capacitive sensor 190 has been attached are placed on the holder 120 to which the actuator 130 and rubber member 125A have been attached.

Then, the four screws 101 are inserted into the four through-holes 113 in the lower case 110 from the lower side, are passed through the four through-holes 163 in the base 160, and are screwed into the four screw holes 183A in the knob 180. This completes the switch 100 illustrated in FIG. 1.

The lower case 110, base 160, and knob 180 are integrally fixed by the screws 101. In this state, the circuit board 170 is fixed in a state in which the circuit board 170 is sandwiched between the walls 162 of the base 160 and the side walls 182 and extensions 183 of the knob 180.

Although the holder 120 is positioned between the lower case 110 and the base 160, the holder 120 is not in direct contact with the lower case 110 or base 160 but holds the base 160 through the dampers 140. The main body 121 of the holder 120 is accommodated in a space created between the lower case 110 and the base 160 when a contact is made between the walls 112 of the lower case 110 and the lower surface of the main body 161 of the base 160.

A spacing is provided between the upper surface of the main body 111 of the lower case 110 and the lower surface of the main body 121 of the holder 120, as illustrated in FIG. 4, so there is no contact between the upper surface and lower surface. The base 160 is in contact with the holder 120 only at portions at which the dampers 140 intervene. A contact between the base 160 and the holder 120 is an indirect contact through the dampers 140, actuator 130, and rubber member 125A.

The upper surface of the actuator 130 disposed in the recessed portion 121A in the holder 120 is in contact with the lower surface of the base 160 in a state in which the dampers 140 are sandwiched between the holder 120 and the base 160. In other words, the actuator 130 is fixed in a state in which it is sandwiched between the bottom surface of the recessed portion 121A and the lower surface of the base 160.

By fixing the holder 120 so as to be sandwiched between the lower case 110 and the base 160 as described above, it is possible to stably maintain a state in which the dampers 140 and actuator 130 are in contact with the base 160. As a result of this, the lower case 110 and base 160, which form the movable body, can be stably vibrated when the actuator 130 is driven. Furthermore, as a result of this, the knob 180 can also be stably vibrated, which is connected to the lower case 110 and base 160, which form the movable body.

Therefore, the switch 100 has a structure in which the lower case 110, base 160, and knob 180 as well as the circuit board 170, LEDs 175, and capacitive sensor 190, which are disposed between the lower case 110 and the knob 180, on upper surfaces, or the like can be vibrated by the holder 120 through the dampers 140, and are held so as to be movable in the Z direction within a range in which the contraction of the damper 140 is allowed.

In other words, the lower case 110, base 160, circuit board 170, knob 180 and members provided on them are attached so that they can move or vibrate with respect to the holder 120 when the actuator 130 operates. The holder 120 is the stationary member, and the lower case 110, base 160, circuit board 170, knob 180, and members disposed on them form the movable member. Of the movable member, the lower case 110 and base 160, which are held by the holder 120 so as to be operatable by sandwiching the holder 120 and are directly vibrated by the actuator 130, form the movable body. When this movable body vibrates, the knob 180 is vibrated.

A pressing manipulation is performed on the manipulation surface 100A, the pressing force is transmitted to the pressure sensor 150 through the knob 180, circuit board 170, and base 160.

When the pressing manipulation is detected by the pressure sensor 150, the external control device connected to the switch 100 drives the actuator 130. At this time, the control device determines that the pressing manipulation has been performed for either of a half area of the manipulation surface 100A on the +X-direction side and the other half area on the −X-direction side, according to a detection result from the capacitive sensor 190. Then, the control device turns on the LED 175 corresponding to the area on which the pressing manipulation has been performed.

When the actuator 130 is driven, vibration is transmitted from the holder 120 fixed to the panel 200 through the dampers 140 to the base 160. Then, the lower case 110 and knob 180, which are fixed together with the base 160, as well as the circuit board 170 and the like sandwiched between the lower case 110 and the knob 180 vibrate.

The switch module 300 including the switch 100 as described above can be assembled (manufactured) as follows.

The four screws 102 are passed through the four through-holes 122A in the holder 120 in a state in which the manipulation surface 100A of the switch 100 is aligned so as to be exposed from the opening 210A in the panel 200 and then are screwed into the screw holes 221A in the screwing sections 220A on the panel 200. This completes the switch module 300 illustrated in FIG. 3.

A possible solution to enhance the design of the switch module 300 is to attach the decorative sheet 250 to the upper surface of the switch module 300 as illustrated in FIG. 3. In this case, when the switch 100 is attached to the panel 200, the spacer 165 may be attached between the upper surface of the leg 164 of the base 160 and the lower end of the screwing section 220B on the panel 200.

For example, when the decorative sheet 250 is attached to the upper surface (manipulation surface 100A and upper surface 200A) of the switch module 300 with an adhesive or the like, the adhesive is applied to the upper surface of the switch module 300, after which the decorative sheet 250 is placed on the upper surface of the switch module 300 and is then pressurized. At this time, a large stress is applied to the upper surface of the switch module 300. However, by restricting the downward movement of the knob 180 with the spacers 165, it is possible to prevent a load from being applied to the actuator 130 and pressure sensor 150. Thus, when the decorative sheet 250 is attached to the upper surface of the switch module 300, it is possible to suppress damage to the actuator 130 and pressure sensor 150.

After the attachment of the decorative sheet 250 has been completed, when the screws 166 are removed and the spacers 165 are pulled out and are then removed, the knob 180 enters a state in which it can shift downward. Since the decorative sheet 250 is attached across the manipulation surface 100A of the switch 100 and the upper surface 200A of the panel 200, vibration generated on the manipulation surface 100A propagates to the upper surface 200A of the panel 200. In this case, an uncomfortable feeling may be felt during manipulation or an abnormal sound is generated due to resonance or the like. When the decorative sheet 250 is formed from a sheet that has a predetermined elasticity with which vibration can be absorbed, however, it is possible to prevent vibration generated on the manipulation surface 100A from propagating to the upper surface 200A of the panel 200.

As described above, the switch 100 can be attached to the panel 200 by passing the screws 102 through the four through-holes 122A in the holder 120 and then screwing the screws 102 into the four screw holes 221A in the screwing sections 220A in the panel 200.

In a state in which the switch 100 is attached to the panel 200, the four through-holes 122A are disposed so as to enclose the opening 210A in plan view and are evenly positioned around the opening 210A in a rectangular shape in plan view. Therefore, on the lower side of the opening 210A in the panel 200, the holder 120 is stably fixed to the panel 200 so as to pass over the opening 210A. Rigidity for attachment of the holder 120 to the panel 200 is evened in a flat plane with respect to the center 210C of the opening 210A.

Therefore, when the actuator 130 disposed on the holder 120, which is evenly and stably fixed to the panel 200, is driven, vibration is transmitted to the base 160, which is connected to the holder 120 through the dampers 140. Then, the lower case 110 and knob 180, which are fixed together with the base 160, as well as the circuit board 170 and the like sandwiched between the lower case 110 and the knob 180 vibrate.

The lower case 110, base 160, and knob 180 as well as the circuit board 170 and the like sandwiched between the lower case 110 and the knob 180 evenly vibrate. As a result, vibration generated on the manipulation surface 100A is even, so an uncomfortable feeling is less likely to be felt during manipulation. Since, at that time, the switch 100 is placed in the opening 210A in the panel 200 through a gap, the vibration of the lower case 110, base 160, and knob 180 as well as the circuit board 170 and the like sandwiched between the lower case 110 and the knob 180 does not propagate to the panel 200. Therefore, an uncomfortable feeling is not generated during manipulation, and an abnormal sound is not generated.

Therefore, it is possible to provide the switch 100, the switch module 300, and the method of manufacturing the switch module 300 that can all evenly vibrate the manipulation surface 100A.

So far, an aspect has been described in which the holder 120 has four through-holes 122A and, in a state in which the switch 100 is attached to the panel 200, two through-holes 122A are arranged in the X direction on the +Y-direction side of the opening 210A in plan view and the remaining two through-holes 122A are arranged in the X direction on the −Y-direction side of the opening 210A in plan view.

However, the number of through-holes 122A may be any number if it is 3 or more. The positions of the through-holes 122A and their count may be other than described above if rigidity for attachment of the holder 120 to the panel 200 is evened in a flat plane.

An aspect has been described in which the switch 100 includes the lower case 110 and base 160 as the movable body. However, the movable body may have a structure in which the movable body includes the base 160 and does not include lower case 110. In this case, it suffices to attach the base 160 to the holder 120 so as to be movable in the Z direction.

So far, an aspect has been described in which the spacer 165 is sandwiched between the leg 164 on the base 160 and the screwing section 220B on the panel 200. However, this embodiment is not limited to this aspect. For example, the circuit board 170 may have a portion (protrusion portion) protruding in the Y direction, and the spacer 165 may be sandwiched between the protrusion portion on the circuit board 170 and the screwing section 220B on the panel 200. Alternatively, the knob 180 may have a portion (protrusion portion) protruding in the Y direction, and the spacer 165 may be sandwiched between the protrusion portion on the knob 180 and the screwing section 220B on the panel 200.

The position, on the panel 200, of the screwing section 220B is not limited to the position illustrated in FIG. 3. The position may be any position if a downward shift of the knob 180 can be suppressed by providing the spacer 165.

There may be the fear that when the decorative sheet 250 is attached to the upper surface of the switch module 300 with an adhesive, the vibration of the manipulation surface 100A is transmitted to the upper surface 200A of the panel 200 because the adhesive enters the gap G between the manipulation surface 100A and the opening 210A (specifically, the gap G between the side wall 182 of the knob 180 and the inner wall of the through-hole 210). This type of fear can be eliminated by taking countermeasures as described below. These countermeasures can also be taken when there is the fear that the vibration of the switch 100 is hindered because the adhesive enters the gap G as described above.

Figure 10A:
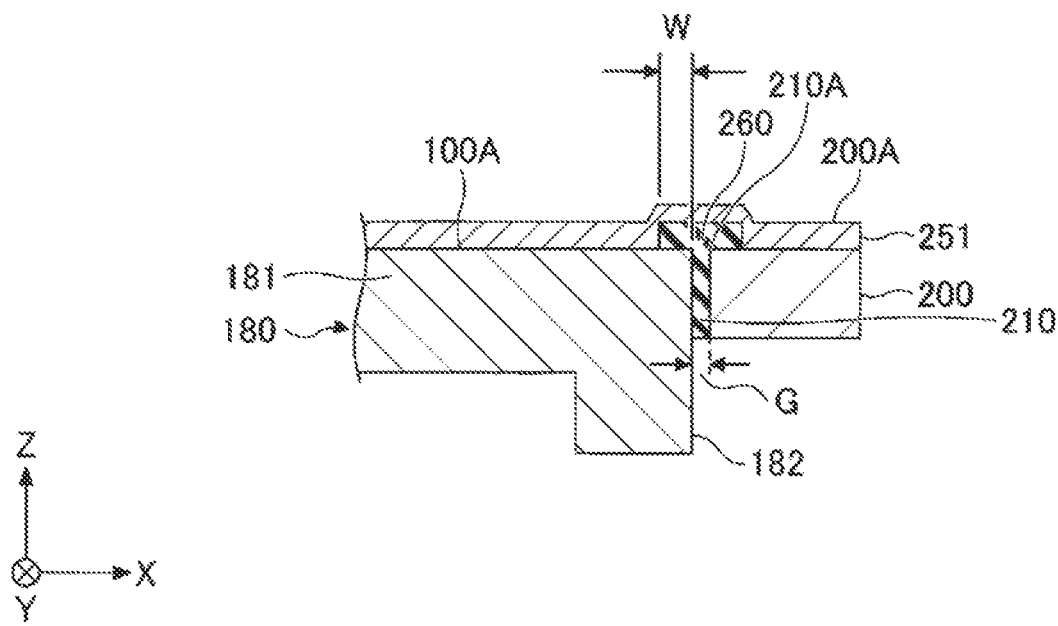
FIG. 10A illustrates a process to attach a decorative sheet by using a masking member.
Figure 10B:
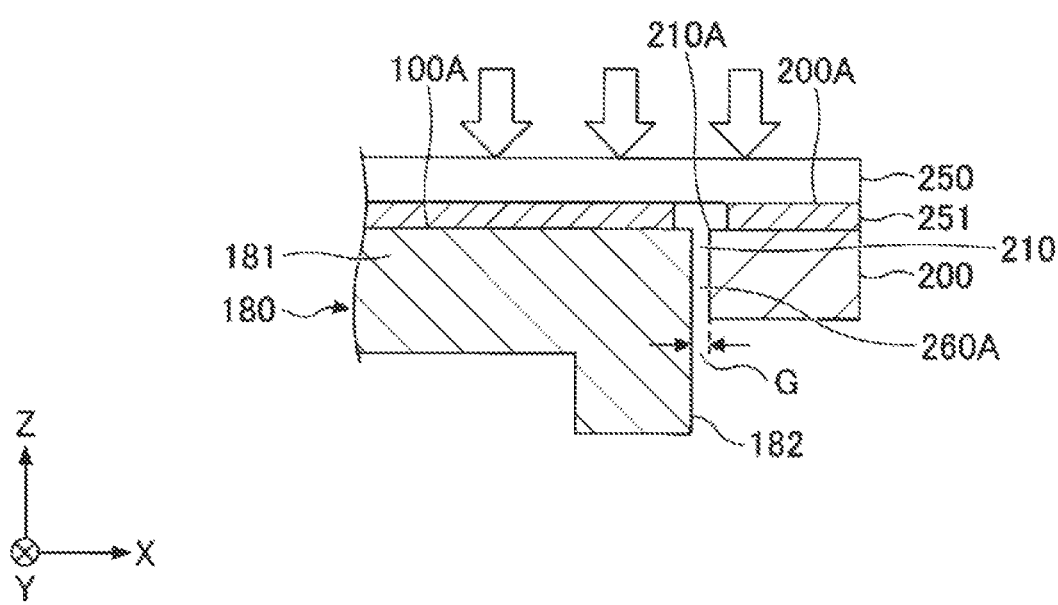
FIG. 10B also illustrates the process to attach the decorative sheet by using the masking member.

FIGS. 10A and 10B illustrate the process to attach the decorative sheet 250 by using a masking member 260. FIG. 10A is a sectional view illustrating a state in which an adhesive 251 has been applied to the manipulation surface 100A, the upper surface 200A, and the top of the masking member 260. FIG. 10B illustrates a state in which the masking member 260 was removed in the state in FIG. 10A and the decorative sheet 250 has been attached and is being pressurized by applying a downward stress from above as indicated by the arrow.

As illustrated in FIG. 10A, the masking member 260 in a T-shape in XZ sectional view is provided in the gap G between the opening 210A and the side wall 182 of the knob 180 and on the manipulation surface 100A and upper surface 200A, which sandwich the gap G. The masking member 260 can prevent the adhesive 251 from being applied. For example, the masking member 260 is formed by fitting a masking member in a frame shape.

After the masking member 260 has been formed, when the adhesive 251 is applied to the manipulation surface 100A, the upper surface 200A, and the top of the masking member 260, the adhesive 251 is applied to the upper surface of the masking member 260 and to the whole of the manipulation surface 100A and upper surface 200A.

Since the masking member 260 is also present in the gap G between the opening 210A and the side wall 182 of the knob 180, even when the adhesive 251 is applied from above the manipulation surface 100A and upper surface 200A, the adhesive 251 does not enter the gap G.

An area in which to provide the masking member 260 on the manipulation surface 100A includes a portion along the gap G and an area having a width W from the boundary between the area and the gap G in the X direction. The area with the width W on the manipulation surface 100A is an example of a first area, which is adjacent to the gap G and in which an adhesive is not present. The area with the width W on the upper surface 200A is an example of a second area, which is adjacent to the gap G and in which an adhesive is not present. The width W is in a direction in which the first area and second area are linked together.

The width W only needs to be set to at least the width of an area that appears after the masking member 260 has been removed and into which the adhesive 251 intrudes due to swelling between the manipulation surface 100A and the lower surface of the decorative sheet 250. This is also true for the upper surface 200A.

The adhesive 251 is a urethane or epoxy adhesive as an example. The masking member 260 is a frame-like member formed from rubber or the like, as an example.

When the masking member 260 is removed, a portion on the masking member 260, the portion being part of the adhesive 251 illustrated in FIG. 10A, is removed. When the decorative sheet 250 is placed on the adhesive 251 in this state and is then pressurized from above the decorative sheet 250, the adhesive 251 comes close to the gap G due to swelling. However, an area 260A created after the masking member 260 has been removed is also present on the manipulation surface 100A and upper surface 200A as illustrated in FIG. 10B, so it is possible to restrain the adhesive 251 from entering the gap G. The area 260A is an example of a hollow portion.

As a result of this, it is possible to provide the switch 100, the switch module 300, and the method of manufacturing the switch module 300, that can all restrain the vibration of the manipulation surface 100A from being transmitted to the upper surface 200A of the panel 200 and can cause the manipulation surface 100A to evenly vibrate.

When the masking member 260 is formed from a masking material to which the adhesive 251 does not adhere, the masking member 260 may be left without being removed. The decorative sheet 250 may be attached in a state in which the masking member 260 is left. In this case, it suffices for the masking member 260 to have elasticity that prevents the vibration of the knob 180 from being transmitted to the panel 200.

At that time, since the masking member 260 with a certain thickness is placed on the manipulation surface 100A of the switch 100 and on the upper surface 200A of the panel 200, when the decorative sheet 250 is attached, the layer of the adhesive 251 is divided by the masking member 260. Thus, it is possible to prevent the vibration of the manipulation surface 100A from propagating to the panel 200.

Since the masking member 260 is present across the area with the width W on the manipulation surface 100A and the area with the width W on the upper surface 200A, an area (non-existence area) 251 on which the adhesive is not present can be expanded. As a result of this, the propagation of the vibration of the manipulation surface 100A to the panel 200 can be more effectively suppressed.

This completes the description of the switch, the switch module, and the method of manufacturing the switch module in an exemplary embodiment in the present invention. The present invention is not limited to a concretely disclosed embodiment. Various variations and modifications are possible without departing from the intended scope of the claims of the present invention.

This international application claims priority based on Japanese Patent Application No. 2020-019043 filed on Feb. 6, 2020, and the entire contents of the application are incorporated in this international application by reference in it.

What is claimed is:

1. A switch to be attached to a panel having an opening in a surface, the switch comprising:
    a stationary member to be attached to the panel;
    a movable member to be placed at a distance from the panel, the movable member having a manipulation surface separated from the panel in the opening with a gap intervening between the manipulation surface and the panel, the manipulation surface being exposed from the opening; and
    a vibration element disposed between the stationary member and the movable member, the vibration element being configured to vibrate the movable member,
    wherein the movable member has:
        a manipulation member having the manipulation surface, the manipulation member being placed at a distance from the panel; and
        a movable body movable together with the manipulation member relative to the stationary member,
    a first surface of the vibration element is fixed to the stationary member, and
    a second surface of the vibration element is in contact with the movable body, and the second surface is opposite to the first surface.

2. The switch according to claim 1, wherein:
    the movable body has a base portion disposed between the manipulation member and the stationary member, the base portion being fixed together with the manipulation member, the base portion being configured to be movable together with the manipulation member, relative to the stationary member;
    the first surface of the vibration element is fixed to a surface of the stationary member, the surface being on a same side as the base portion; and
    the second surface, opposite to the first surface, of the vibration element is in contact with a surface of the base portion, the surface being on a same side as the stationary member.

3. The switch according to claim 2, wherein:
    the movable body further has a case member placed opposite to the base portion with the stationary member intervening between the case member and the base portion, the case member being fixed together with the base portion; and
    the case member is movable together with the manipulation member and the base, relative to the stationary member.

4. The switch according to claim 2, further comprising an elastic member having a predetermined spring constant, the elastic member being disposed between the base portion and the stationary member, the elastic member being configured to hold the base portion so as to be movable relative to the stationary member.

5. The switch according to claim 4, wherein a plurality of elastic members are placed so as to have point symmetry or line symmetry around the vibration element in plan view.

6. The switch according to claim 4, wherein a plurality of elastic members are placed so as to sandwich the vibration element in a plan view.

7. The switch according to claim 2, further comprising a pressing manipulation detection unit disposed at the base portion, the pressing manipulation detection unit being configured to detect a pressing manipulation to the manipulation surface.

8. The switch according to claim 2, wherein:
    the movable member further has a plate member disposed between the manipulation member and the base portion; and
    when a pressing manipulation to the manipulation surface is performed, the base portion is pressed by the manipulation member through the plate member.

9. The switch according to claim 8, further comprising a restricting member disposed between the plate member and the panel, the restricting member being configured to restrict movement of the manipulation member and of the plate member in a direction of a pressing manipulation to the manipulation surface.

10. The switch according to claim 8, further comprising a light source mounted at the plate member, wherein
    the manipulation member has a transmission portion configured to transmit light output by the light source.

11. The switch according to claim 2, further comprising a restricting member disposed between the base portion and the panel, the restricting member being configured to restrict movement of the manipulation member and of the base portion in a direction of a pressing manipulation to the manipulation surface.

12. The switch according to claim 2, further comprising a restricting member disposed between the manipulation member and the panel, the restricting member being configured to restrict movement of the manipulation member and of the base portion in a direction of a pressing manipulation to the manipulation surface.

13. The switch according to claim 1, wherein the vibration element vibrates in a direction perpendicular to the manipulation surface.

14. The switch according to claim 1, further comprising a position detection unit disposed at the manipulation surface, the position detection unit being configured to detect a position at which a pressing manipulation to the manipulation surface is performed.

15. A switch to be attached to a panel having an opening in a surface, the switch comprising:
    a stationary member to be attached to the panel;
    a movable member to be placed at a distance from the panel, the movable member having a manipulation surface separated from the panel in the opening with a gap intervening between the manipulation surface and the panel, the manipulation surface being exposed from the opening; and
    a vibration element disposed between the stationary member and the movable member, the vibration element being configured to vibrate the movable member,
    the movable member has:

a manipulation member having the manipulation surface, the manipulation member being placed at a distance from the panel; and a movable body movable together with the manipulation member relative to the stationary member, the switch further comprises an elastic member having a predetermined spring constant, the elastic member is disposed between the movable body and the stationary member, and the elastic member is configured to hold the movable body so as to be movable relative to the stationary member, a first surface of the vibration element is fixed to a surface of the stationary member, and the surface is on a same side as the movable body, the vibration element is disposed between the movable body and the stationary member, and the manipulation member and the movable body are held by the elastic member so as to be vibratable with respect to the stationary member.

16. The switch according to claim 15, wherein a plurality of elastic members are placed so as to have point symmetry or line symmetry around the vibration element in a plan view.

\* \* \* \* \*